United States Patent
Wright et al.

(10) Patent No.: US 6,492,881 B2
(45) Date of Patent: Dec. 10, 2002

(54) SINGLE TO DIFFERENTIAL LOGIC LEVEL INTERFACE FOR COMPUTER SYSTEMS

(75) Inventors: Mitchel E. Wright, The Woodlands, TX (US); Joe D. Stoddard, Houston, TX (US)

(73) Assignee: Compaq Information Technologies Group, L.P., Houston, TX (US)

( * ) Notice: Subject to any disclaimer, the term of this patent is extended or adjusted under 35 U.S.C. 154(b) by 0 days.

(21) Appl. No.: 09/773,879

(22) Filed: Jan. 31, 2001

(65) Prior Publication Data

US 2002/0101294 A1 Aug. 1, 2002

(51) Int. Cl.$^7$ ................................................ H01P 5/10
(52) U.S. Cl. .......................... 333/26; 333/25; 333/260
(58) Field of Search ........................... 333/26, 12, 260, 333/246, 254

(56) References Cited

U.S. PATENT DOCUMENTS

| | | | | |
|---|---|---|---|---|
| 5,534,830 A | * | 7/1996 | Ralph | 333/117 |
| 5,628,057 A | * | 5/1997 | Phillips et al. | 333/127 |
| 5,781,078 A | * | 7/1998 | Jones | 333/12 |

OTHER PUBLICATIONS

Cleon Petty and Todd Pearson, 2/98, Motorola, Inc., "Designing With PECL (ECL at +5.OV)" AN1406 Application Note, (pp. 1–7, 8 pages total), AN1406/D Figure 6, Generic Driver/Receiver Pair.

National Semiconductor, Nov. 1996, "DS90CR281/DS90CR282 28–Bit Channel Link", 1996 National Semiconductor Corporation TL/F/13638, (pp. 1–13, 14 pages total), Physical Dimensions (millimeters).

* cited by examiner

*Primary Examiner*—Benny Lee
*Assistant Examiner*—Kimberly E Glenn
(74) *Attorney, Agent, or Firm*—Akin Gump Strauss Hauer & Feld LLP

(57) ABSTRACT

Single to differential interfacing. The present invention provides for an efficient solution to transform an output from a single ended source to a pair of differential signals that are provided to a differential receiver. The differential receiver is any number of devices including a differential clock receiver. The differential signals may be referenced to voltages used to receiver power supply voltages. The present invention obviates the need for an additional differential driver and its required additional devices that are need to perform transformation of a single ended signal to a pair of differential signals. There can be significant cost savings in using the single to differential interfacing that is performed in accordance with the present invention. In one embodiment, two independent power and ground planes are communicatively coupled via a transmission line, or a transmission line-like traces on a printed circuit board, are used to provide uniform impedance control for all return paths within a system. These transmission lines or transmission line-like traces on the printed circuit board have characteristic impedances higher than the characteristic impedances of other transmission paths in the system or the other traces on the printed circuit board. Moreover, a power supply that is used to bias the single ended source is floated with respect to the system ground. The present invention allows for interfacing single ended devices to devices that use differential inputs signals via a cost effective solution in terms of component costs, real estate costs, and in terms of complexity.

3 Claims, 9 Drawing Sheets

SINGLE TO DIFFERENTIAL LOGIC LEVEL INTERFACE FOR COMPUTER SYSTEMS

BACKGROUND

1. Technical Field

The present invention relates generally to device interfacing; and, more particularly, it relates to interfacing a single ended device to a device employing differential inputs.

2. Related Art

There is a movement in the art towards devices that use or require differential inputs. There have been some conventional approaches that have sought to perform the interfacing of a single ended signal to a device necessitating differential inputs. One conventional approach seeks to isolate signals. This is done by separating traces on a printed circuit board (PCB) and by providing extra ground paths through connectors or in and out of integrated circuit (IC) packages. One deficiency in this approach is that isolating these signals does not eliminate shared paths altogether. Cross-talk between the signals is reduced, but it may not be completely eliminated.

Another conventional approach uses a differential driver that provides source and return connections for every signal. This second conventional approach allows cross-talk problems to be somewhat minimized, since each signal has its own dedicated return path. However, using these differential drivers necessitates special devices and more pins within a system, thereby increasing real estate consumption, cost, and complexity within a system. In certain applications where these constraints are rigid, the incremental addition of cost and complexity may make it impracticable to use such a conventional solution. The use of these differential drivers requires the use of other special devices more pins to perform the proper interfacing. This conventional approach is exemplary of a brute force method that puts little emphasis on cost savings in any number of terms including: money, real estate, and complexity.

Further limitations and disadvantages of conventional and traditional systems will become apparent to one of skill in the art through comparison of such systems with the present invention as set forth in the remainder of the present application with reference to the drawings.

SUMMARY OF THE INVENTION

Various aspects of the present invention can be found in a single to differential interface. The single to differential interface includes a first isolated power and ground plane and a second isolated power and ground plane. The first isolated power and ground plane generates a single ended source output having a first current magnitude. The second isolated power and ground plane is communicatively coupled to the first isolated power and ground plane via a substantially transmission-like connection. The second isolated power and ground plane receives a pair of differential signals. The first isolated power and ground plane receives a return signal via a single return path, the return signal having a second current magnitude.

In certain embodiments of the invention, the substantially transmission-like connection includes a number of transmission lines. One of the transmission lines has a first characteristic impedance and at least one other of the transmission lines has a second characteristic impedance. The first current magnitude and the second current magnitude are substantially of a common magnitude. The substantially transmission-like connection includes a number of connection types including a trace on a printed circuit board. The substantially transmission-like connection is operable across a predetermined frequency range at which the single ended source output is operable to be modulated. The predetermined frequency range spans from DC to a maximum switching frequency. One of the differential signals of the pair of differential signals is referenced through a resistance to a voltage logic level.

Other aspects of the present invention can be found in a single to differential interface. The single to differential interface includes a single ended source, a single to differential interface circuitry, and a differential receiver. The single ended source emits a single ended source output. The single to differential interface circuitry is operable to convert the single ended source output to a pair of differential outputs. The differential receiver receives the pair of differential outputs. The single to differential interface circuitry employs a substantially transmission-like connection between the single ended source and the differential receiver.

In certain embodiments of the invention, the substantially transmission-like connection includes a number of connection types including a trace on a printed circuit board. The differential receiver includes a printed circuit board trace having a first characteristic impedance, and the substantially transmission-like connection includes an interface trace having a second characteristic impedance. The second characteristic impedance is larger than the first characteristic impedance. One of the differential outputs of the pair of differential outputs is referenced through a resistance to a voltage logic level. The single to differential interface also includes a floating power supply that biases the single ended source. In other embodiments, a current being transmitted from the single ended source includes a magnitude that is substantially equal to a magnitude of a current that is received by the single ended source.

Other aspects of the present invention can be found in a single to differential interface method. The method includes referencing a single ended source output signal to a floating single ended source ground, implementing a differential interface that is referenced to a system ground, and referencing a number of differential signals to a number of receiver power supply voltages.

In certain embodiments of the invention, one of the differential signals is referenced to one of a voltage logic level low or a voltage logic level high. The method also includes using uniform impedance control, and the uniform impedance control is operable to ensure a single return current path. The method also includes connecting a first isolated power and ground plane to a second isolated power and ground plane via a substantially transmission-like connection. The substantially transmission-like connection includes a number of connection types including an interface trace on a printed circuit board.

Other aspects, advantages and novel features of the present invention will become apparent from the following detailed description of the invention when considered in conjunction with the accompanying drawings.

BRIEF DESCRIPTION OF THE DRAWINGS

A better understanding of the present invention can be obtained when the following detailed description of various exemplary embodiments are considered in conjunction with the following drawings.

DETAILED DESCRIPTION OF THE INVENTION

The present invention is operable to convert a driving source from a single ended signal to differential signals. By running signals in a differential mode, shared path effects are eliminated. Some of the benefits of this differential mode are reduced system noise, and improved transmission and detection of signals. Differential signals may be produced from conventional, non-differential devices. The ability to perform this transformation without isolating signals and without the use of a differential driver results in cost savings and accessibility among other benefits. The use of differential signals generated by the present invention offers many other benefits as well. The parasitic effects from connectors and integrated circuit (IC) packages often induce signal distortion that creates timing "push out and cross talk problems. The use of differential signals, as generated by the present invention, will reduce these effects and improve overall system performance.

Figure 1:
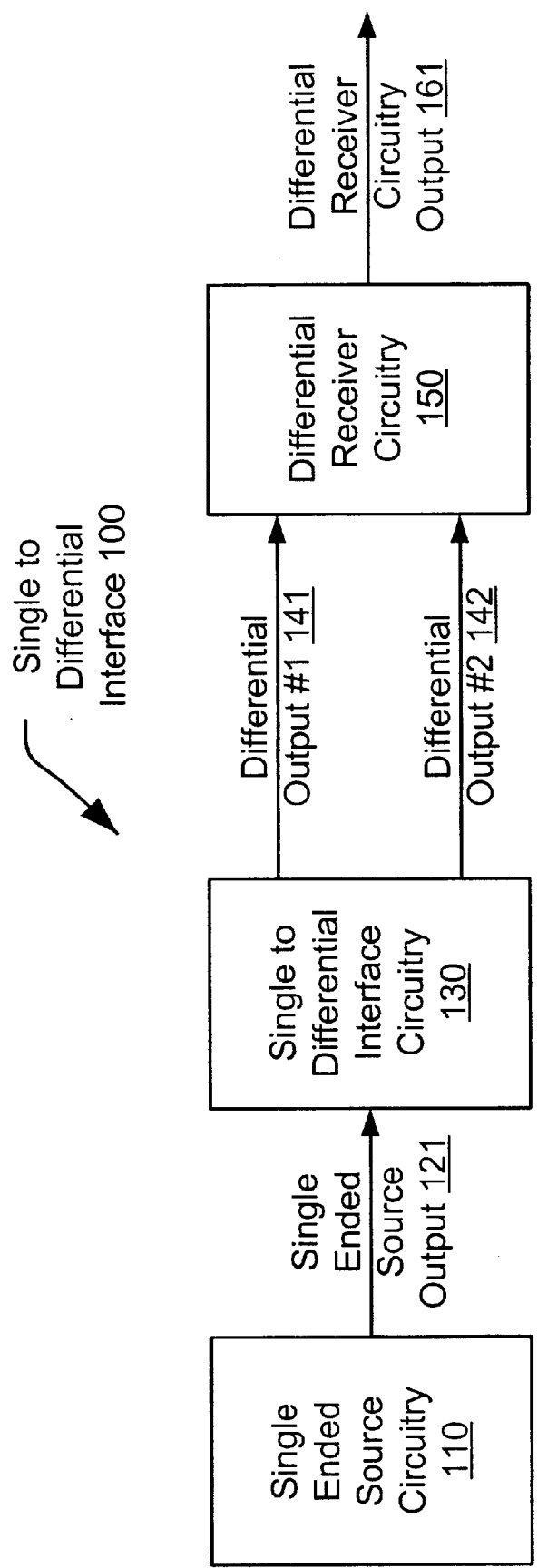
FIG. 1 is a system diagram illustrating an embodiment of a single to differential interface built in accordance with the present invention.

FIG. 1 is a system diagram illustrating an embodiment of a single to differential interface 100 built in accordance with the present invention. A single ended source circuitry 110 provides a single ended source output 121 to a single to differential interface circuitry 130. The single to differential interface circuitry 130 generates two differential signals from the single ended source output 121, namely, a differential output #1 141 and a differential output #2 142. A differential receiver circuitry 150 receives both of the differential output #1 141 and the differential output #2 142. A single output, a differential receiver circuitry output 161, is transmitted from the differential receiver circuitry 150 to any other device. The single to differential interface 100 of the FIG. 1 may be used to perform the transformation of a single ended signal to differential signals to be provided to any number of devices requiring differential inputs.

Figure 2:
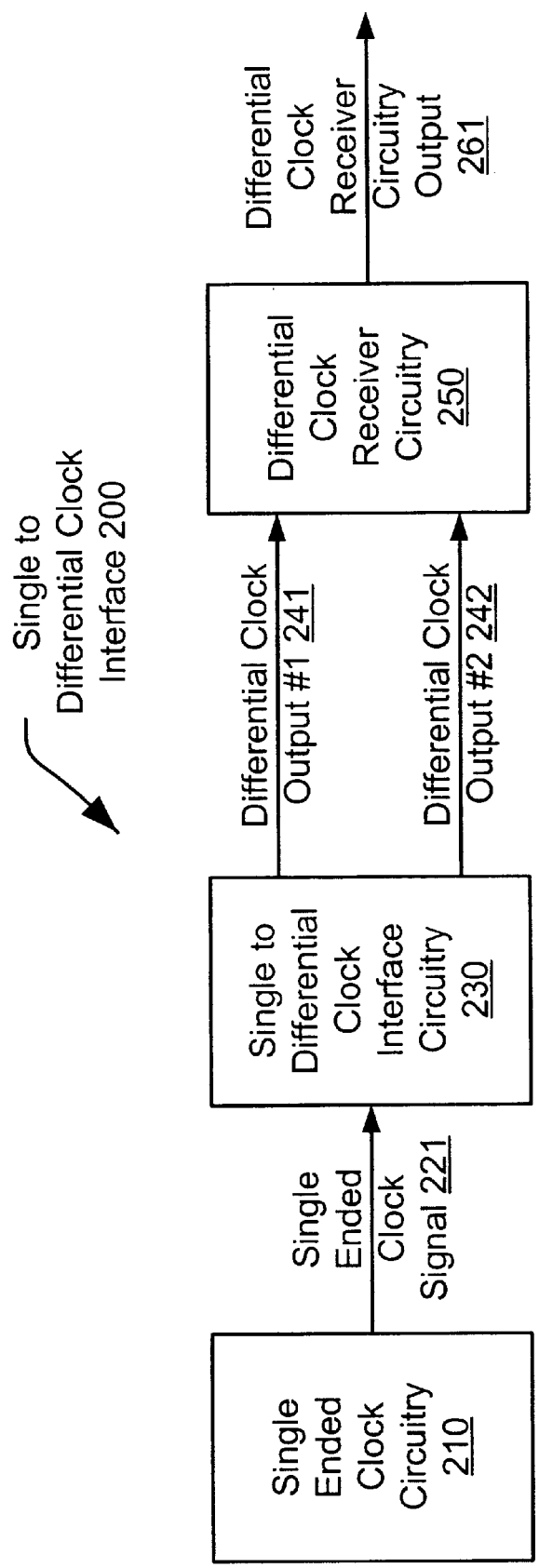
FIG. 2 is a system diagram illustrating an embodiment of a single to differential clock interface built in accordance with the present invention.

FIG. 2 is a system diagram illustrating an embodiment of a single to differential clock interface 200 built in accordance with the present invention. A single ended clock circuitry 210 provides a single ended clock output 221 to a single to differential clock interface circuitry 230. The single to differential clock interface circuitry 230 generates two differential signals from the single ended source output 221, namely, a differential clock output #1 241 and a differential clock output #2 242. A differential clock receiver circuitry 250 receives both of the differential clock output #1 241 and the differential clock output #2 242. A single output, a differential clock receiver circuitry output 261, is transmitted from the differential clock receiver circuitry 250 to any other device. The single to differential clock interface 200 of the FIG. 2 may be used to perform the transformation of a single ended clock signal to differential clock signals to be provided to any number of devices requiring differential inputs.

Figure 3:
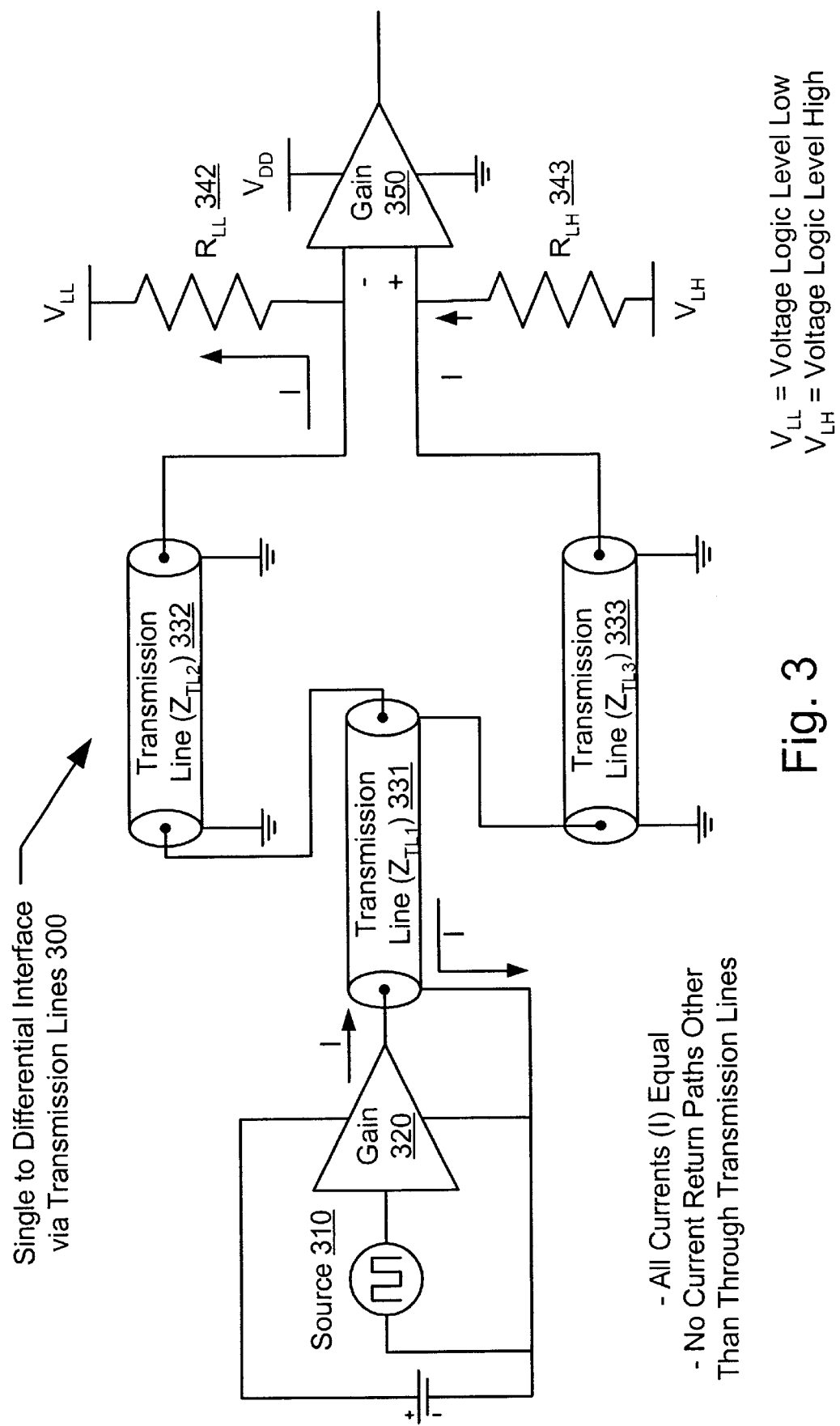
FIG. 3 is a system diagram illustrating an embodiment of a single to differential interface via transmission lines built in accordance with the present invention.

FIG. 3 is a system diagram illustrating an embodiment of a single to differential interface via transmission lines 300 built in accordance with the present invention. A gain 320, biased using a floating DC source, is provided a signal from a source 310. The output from the gain 320 is fed to the transmit path of a transmission line 331 having a characteristic impedance $Z_{TL1}$. In certain embodiments of the invention, the transmission line 331 is exemplary of any type of connection having a substantially transmission-like connection. As will be seen below in other embodiments of the invention, a substantially transmission-like connection is implemented in other forms included traces on a printed circuit board (PCB). The return path of the near end of the transmission line 331 is passed back to the floating low end voltage level of the DC source that biases the gain 320.

The transmit path of the far end of the transmission line 331 feeds a near end of a transmission line 332 having a characteristic impedance $Z_{TL2}$. The return paths of both the near end and the far end of the transmission line 332 are grounded to the system ground of the single to differential interface via transmission lines 300. The signal transmitted from the far end of the transmission line 332 is passed to one of the inputs of a gain 350. For example, the transmit signal through the transmission line 332 passed to the negative input of the gain 350. This signal is referenced through a resistance $R_{LL}$ 342 to a voltage level logic low $V_{LL}$. The gain 350 is biased using a voltage level $V_{DD}$ and is referenced to the system ground of the single to differential interface via transmission lines 300.

The other of the inputs of the gain 350 is connected to the far end of a transmission line 333 having a characteristic impedance $Z_{TL3}$. For example, the signal fed back through the transmission line 333 is from the positive input of the gain 350. This signal is referenced through a resistance $R_{LH}$ 343 to a voltage level logic high $V_{LH}$. The transmit path from the near end of the transmission line 333 is passed to the return path of the far end of the transmission line 331. The return paths of both the near end and the far end of the transmission line 333 are grounded to the system ground of the single to differential interface via transmission lines 300.

There are certain areas within the single to differential interface via transmission lines 300 where the currents are all equal to a value "I." For example, the current transmitted from the gain 320 to the transmit path of the near end of the transmission line 33, and the current received from the receive path of the near end of the transmission line 331 are both equal to the value "I." In addition, the values of the current transmitted through the resistance $R_{LL}$ 342 to the voltage level logic low $V_{LL}$ and the current transmitted from the voltage level logic high $V_{LH}$ the resistance $R_{LH}$ 343 are also equal to the value "I." These currents are of a common magnitude, or of a substantially similar magnitude. The design of the present invention, as shown in the embodiment of the FIG. 3, also ensures that there are no current return paths except through the various transmission lines. The particular values of the characteristic impedances of the transmission lines and the various resistors within the FIG. 3 are variable as required within various applications. One example of particular values that will provide the advantages contained within the present invention is shown below in FIG. 4.

Figure 4:
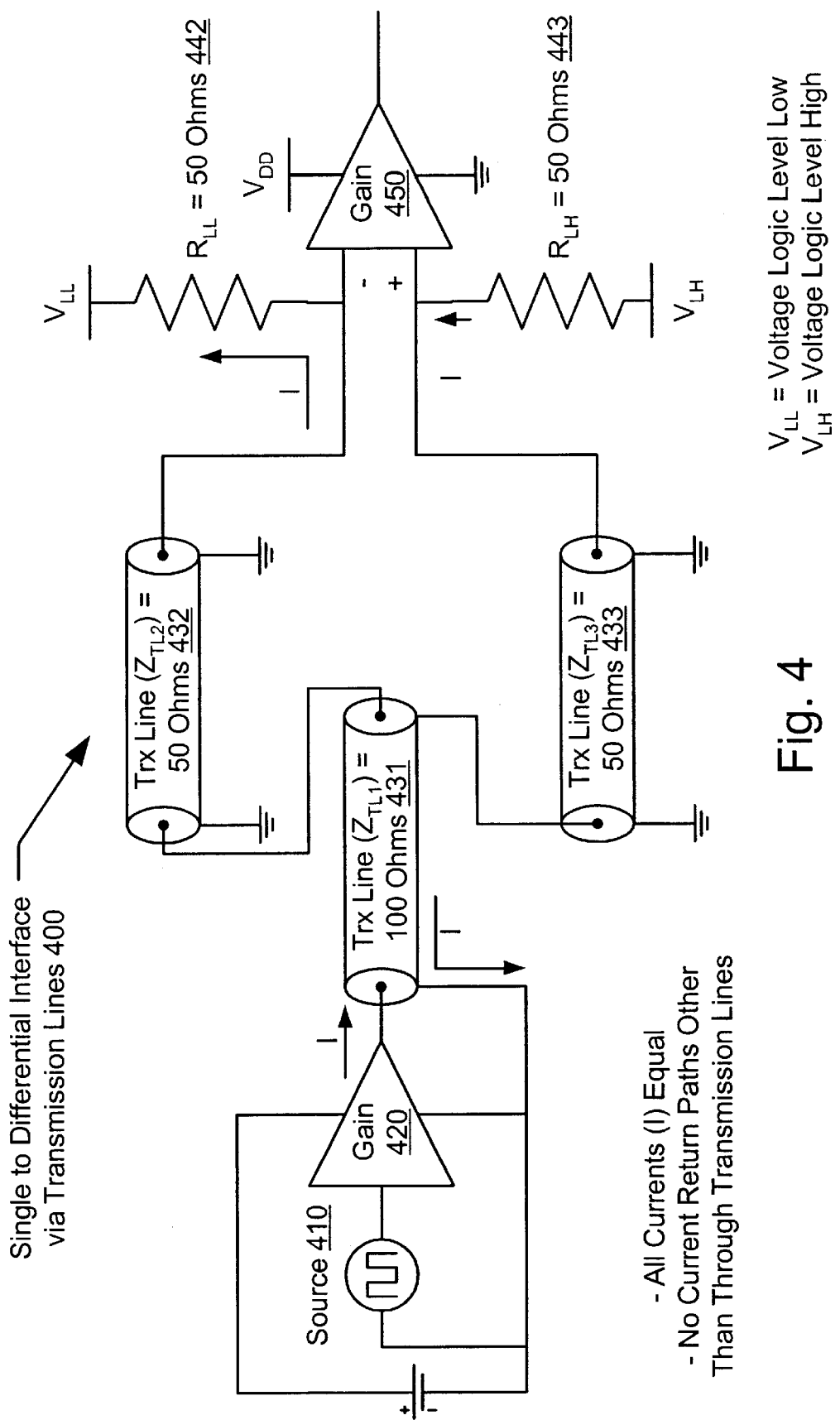
FIG. 4 is a system diagram illustrating another embodiment of a single to differential interface via transmission lines built in accordance with the present invention.

FIG. 4 is a system diagram illustrating another embodiment of a single to differential interface via transmission lines built in accordance with the present invention. A gain 420, biased using a floating DC source, is provided a signal from a source 410. The output from the gain 420 is fed to the transmit path of a transmission line 431 having a characteristic impedance $Z_{TL1}$ that is equal to 100Ω. In certain embodiments of the invention, the transmission line 431 is exemplary of any type of connection having a substantially transmission-like connection. As will be seen below in other embodiments of the invention, a substantially transmission-like connection is implemented in other forms included traces on a printed circuit board (PCB). The return path of the near end of the transmission line 431 is passed back to the floating low end voltage level of the DC source that biases the gain 420.

The transmit path of the far end of the transmission line 431 feeds a near end of a transmission line 432 having a characteristic impedance $Z_{TL2}$ that is equal to 50Ω. The return paths of both the near end and the far end of the transmission line 432 are grounded to the system ground of the single to differential interface via transmission lines 400. The signal transmitted from the far end of the transmission line 432 is passed to one of the inputs of a gain 450. For example, the transmit signal through the transmission line 432 passed to the negative input of the gain 450. This signal is referenced through a resistance $R_{LL}$ 442 that is equal to 50Ω to a voltage level logic low $V_{LL}$. The gain 450 is biased using a voltage level $V_{DD}$ and is referenced to the system ground of the single to differential interface via transmission lines 400.

The other of the inputs of the gain 450 is connected to the far end of a transmission line 433 having a characteristic impedance $Z_{TL3}$ that is equal to 50Ω. For example, the signal fed back through the transmission line 433 is from the positive input of the gain 450. This signal is referenced through a resistance $R_{LH}$ 443 that is equal to 50Ω to a voltage level logic high $V_{LH}$. The transmit path from the near end of the transmission line 433 is passed to the return path of the far end of the transmission line 431. The return paths of both the near end and the far end of the transmission line 433 are grounded to the system ground of the single to differential interface via transmission lines 400.

As within the system shown in the FIG. 3, there are certain areas within the single to differential interface via transmission lines 400 where the currents are all equal to a value "I." For example, the current transmitted from the gain 420 to the transmit path of the near end of the transmission line 43, and the current received from the receive path of the near end of the transmission line 431 are both equal to the value "I." In addition, the values of the current transmitted through the resistance $R_{LL}$ 442 to the voltage level logic low $V_{LL}$ and the current transmitted from the voltage level logic high $V_{LH}$ the resistance $R_{LH}$ 443 are also equal to the value "I." These currents are of a common magnitude, or of a substantially similar magnitude. The value of "I" in the FIG. 3 is not necessarily the same as the value of "I" as shown in the FIG. 4. The design of the present invention, as shown in the embodiment of the FIG. 4, also ensures that there are no current return paths except through the various transmission lines.

Figure 5:
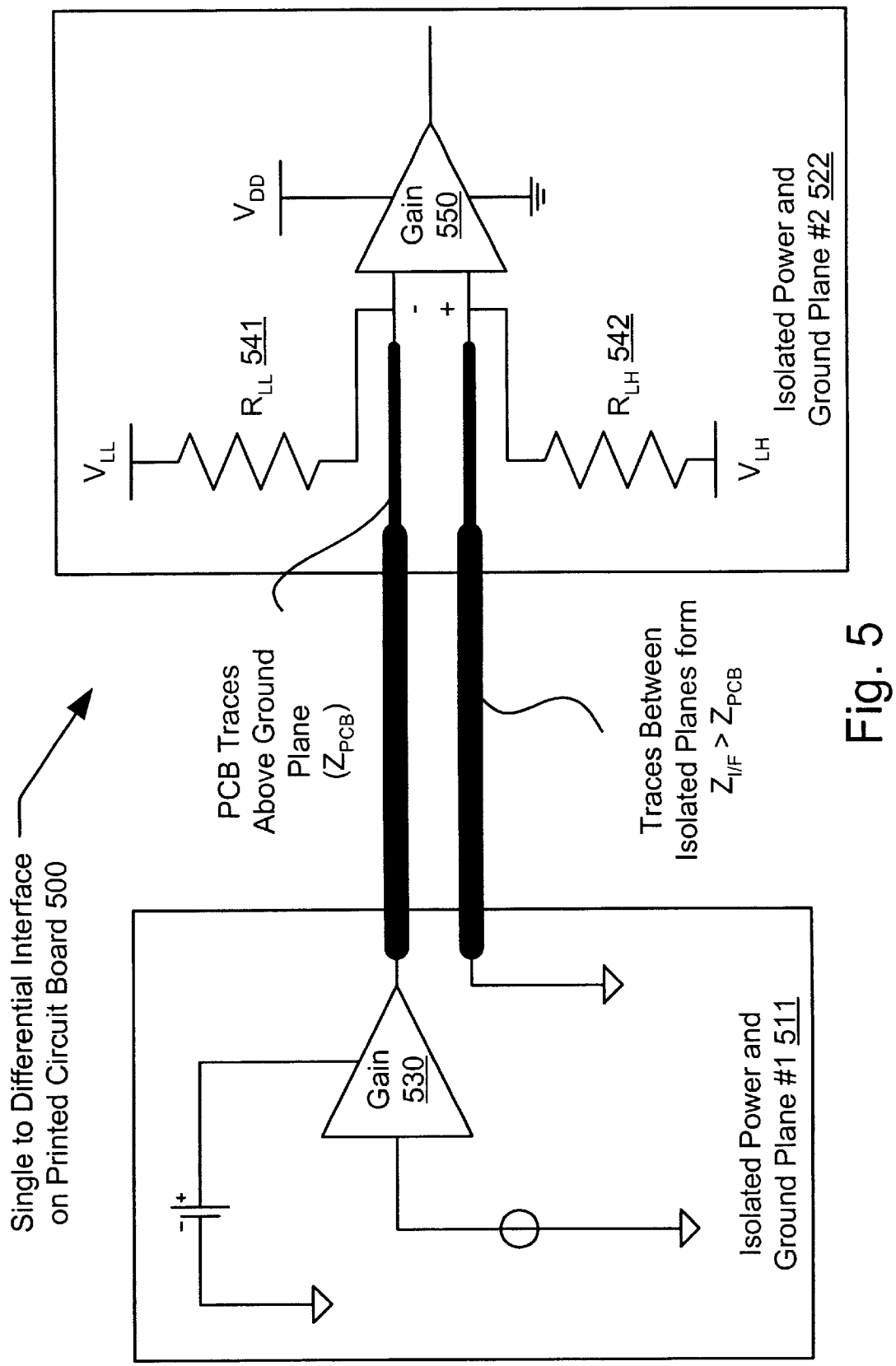
FIG. 5 is a system diagram illustrating an embodiment of a single to differential interface on a printed circuit board built in accordance with the present invention.

FIG. 5 is a system diagram illustrating an embodiment of a single to differential interface on a printed circuit board 500 built in accordance with the present invention. The differential interface on a printed circuit board 500 employs at least two independent isolated power and ground planes. An isolated power and ground plane #1 511 and an isolated power and ground plane #2 522 are both contained within a system that is placed on a printed circuit board. The isolated power and ground plane #1 511 includes a gain 530 that is biased using a floating DC source that is referenced to a common ground on the isolated power and ground plane #1 511. An input, also referenced to the common ground of the isolated power and ground plane #1 511, is provided to the gain 530. The output of the gain 530 is passed to a printed circuit board (PCB) trace that is placed above the ground plane of the entire PCB. This trace may be viewed as being an interface trace from certain perspectives. In certain embodiments of the invention, this interface trace is exemplary of any type of connection having a substantially transmission-like connection.

This interface trace is passed to a trace that is on the isolated power and ground plane #2 522. This trace on board the isolated power and ground plane #2 522 feeds to the negative input of a gain 550, that is referenced through a resistance $R_{LL}$ 541 to a voltage level logic low $V_{LL}$. The gain 550 is biased using a voltage level $V_{DD}$ and is referenced to the system ground of the single to differential interface on a printed circuit board 500. The negative input to the gain 550 is referenced through a resistance $R_{LH}$ 542 to a voltage level logic high $V_{LH}$. In addition, the negative input to the gain 550 is fed to a trace on board the isolated power and ground plane #2 522 that is itself connected to another interface trace on the PCB that connects to the isolated power and ground plane #1 511 . The receiving end of this interface trace, on the isolated power and ground plane #1 511, is connected to the common ground of the isolated power and ground plane #1 511 as well. The interface traces that connect the two isolated power and ground planes 511 and 522 each have a characteristic impedance ($Z_{I/F}$) that is greater than the characteristic impedance of the printed circuit board ($Z_{PCB}$) itself. From certain perspectives, these interface traces that connect the two isolated power and ground planes 511 and 522 are differentiated from the generic traces placed on the PCB.

The design of the present invention, as shown in the embodiment of the FIG. 5, also ensures that there are no current return paths except through the various traces that interconnect the two isolated power and ground planes 511 and 522. The particular values of the characteristic impedances of the various traces and the resistors within the FIG. 5 are variable as required within different applications. One example of particular values that will provide the advantages contained within the present invention is shown below in FIG. 6.

Figure 6:
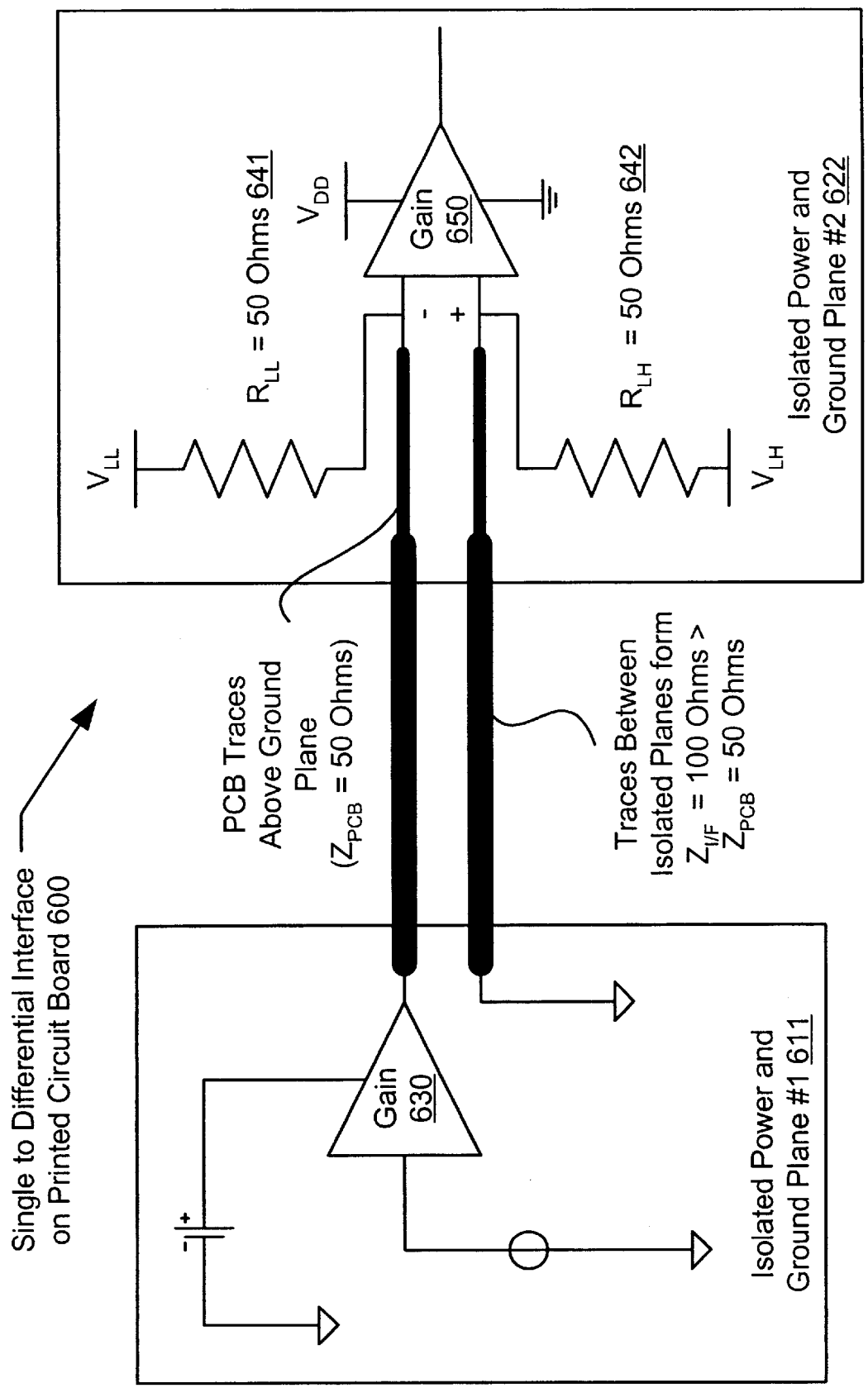
FIG. 6 is a system diagram illustrating another embodiment of a single to differential interface on a printed circuit board built in accordance with the present invention.

FIG. 6 is a system diagram illustrating another embodiment of a single to differential interface on a printed circuit board 600 built in accordance with the present invention. The differential interface on a printed circuit board 600 employs at least two independent isolated power and ground planes. An isolated power and ground plane #1 611 and an isolated power and ground plane #2 622 are both contained within a system that is placed on a printed circuit board. The isolated power and ground plane #1 611 includes a gain 630 that is biased using a floating DC source that is referenced to a common ground on the isolated power and ground plane #1 611. An input, also referenced to the common ground of the isolated power and ground plane #1 611, is provided to the gain 630. The output of the gain 630 is passed to the isolated power and ground plane #2 622 via an interface trace between the two isolated power and ground planes 611 and 622 that has a characteristic impedance equal to 100Ω. This trace may be viewed as being an interface trace from certain perspectives. In certain embodiments of the invention, this interface trace is exemplary of any type of connection having a substantially transmission-like connection.

This 100Ω interface trace is connected to a trace on the isolated power and ground plane #2 622 that has a characteristic impedance equal to 50Ω. This trace 50Ω on board the isolated power and ground plane #2 622 feeds to the negative input of a gain 650, that is referenced through a resistance $R_{LL}$ 641, having a value of 50Ω, to a voltage level logic low $V_{LL}$. The gain 650 is biased using a voltage level $V_{DD}$ and is referenced to the system ground of the single to differential interface on a printed circuit board 600. The negative input to the gain 650 is referenced through a resistance $R_{LH}$ 642, having a value of 50Ω, to a voltage level logic high $V_{LH}$. In addition, the negative input to the gain 650 is fed to a trace on board the isolated power and ground plane #2 622 that has a characteristic impedance equal to 50Ω. The 50Ω trace in the isolated power and ground plane #2 622 is connected to another interface trace having a characteristic impedance of 100Ω interface trace that interconnects the two isolated power and ground planes 611 and 622.

The receiving end of the 100Ω interface trace, on the isolated power and ground plane #1 611, is connected to the common ground of the isolated power and ground plane #1 611 as well. The interface traces that connect the two isolated power and ground planes 611 and 622 each have a characteristic impedance ($Z_{I/F}$) of 100Ω that is greater than the characteristic impedance of the printed circuit board ($Z_{PCB}$) itself that is 50Ω. From certain perspectives, these interface traces that connect the two isolated power and ground planes 611 and 622 are differentiated from the generic traces placed on the PCB, at least in that their characteristic impedances are differentiated from the generic values of characteristic impedances on the PCB.

Again, the design of the present invention, as shown in the embodiment of the FIG. 6, also ensures that there are no current return paths except through the various interface traces that interconnect the two isolated power and ground planes 611 and 622.

Figure 7:
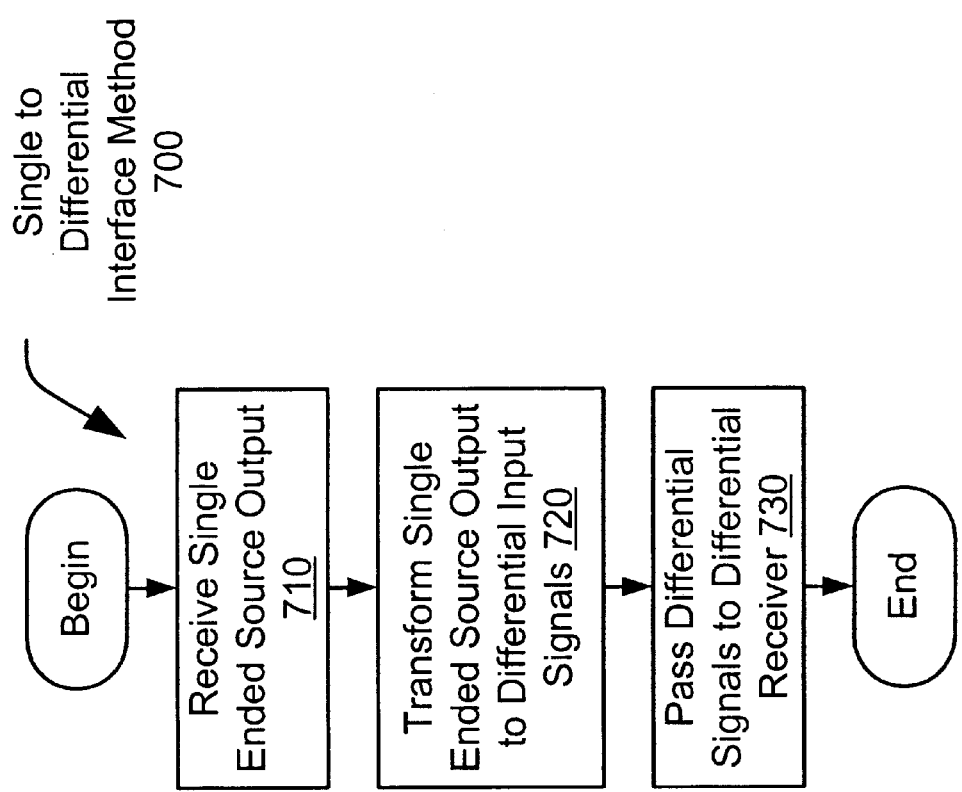
FIG. 7 is a functional block diagram illustrating an embodiment of a single to differential interface method performed in accordance with the present invention.

FIG. 7 is a functional block diagram illustrating an embodiment of a single to differential interface method 700 performed in accordance with the present invention. In a block 710, a single ended source output is received. Then, in a block 720, the single ended source output is transformed to differential input signals. Finally, in a block 730, the differential signals are passed to a differential receiver.

The single to differential interface method 700 is operable generically to perform the transformation of the single ended source output to differential signals that are operable to be used as inputs to a differential receiver. The present invention allows for this transformation without necessitating the use of a differential driver or any additional devices or pins to perform the transformation. The present invention offers a very compressed and efficient solution to perform this transformation.

Figure 8:
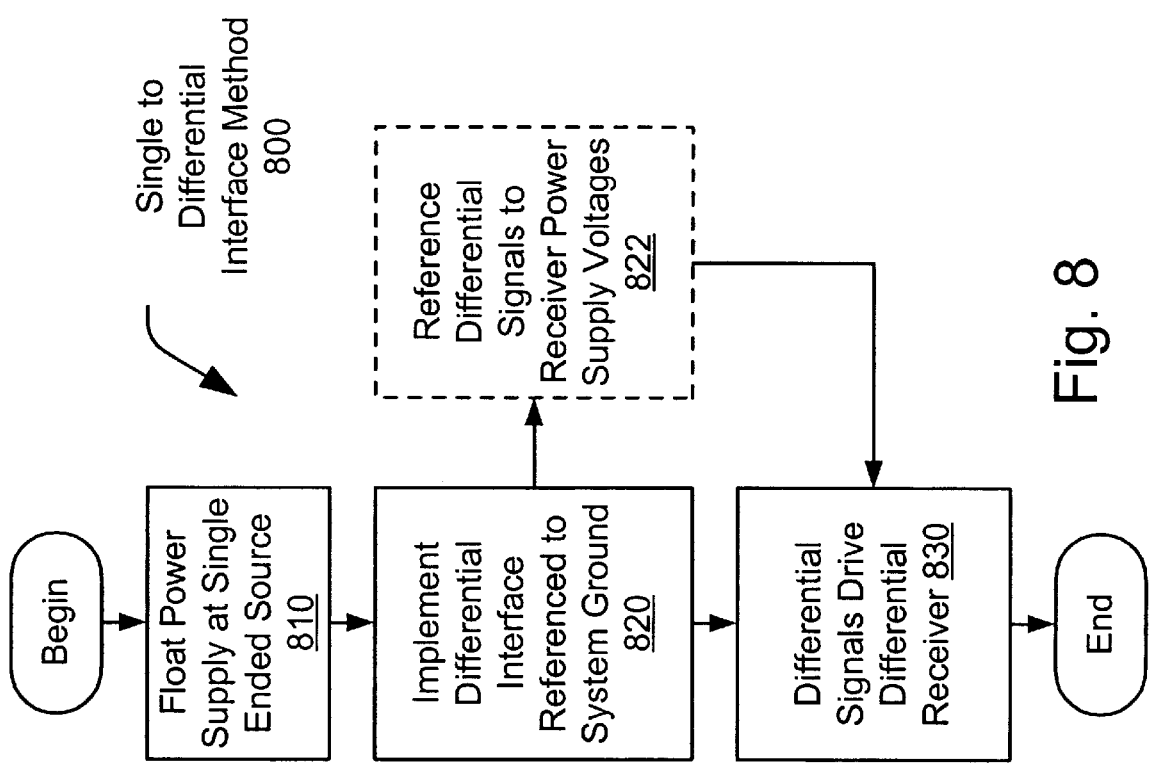
FIG. 8 is a functional block diagram illustrating another embodiment of a single to differential interface method performed in accordance with the present invention.

FIG. 8 is a functional block diagram illustrating another embodiment of a single to differential interface method 800 performed in accordance with the present invention. In a block 810, a power supply is floated at a singled ended source. Then in a block 820, a differential interface referenced to a system ground is implemented. If desired in alternative embodiments, the differential signals are referenced to receiver power supply voltages as shown in an alternative block 822. Finally, in a block 830, the differential signals are used to drive a differential receiver.

The single to differential interface method 800 shows how a floating power supply may be implemented to assist in the transformation of a single ended source output to differential signals. In addition, if desired in alternative embodiments, the differential signals themselves are not referenced to either a common ground of the single ended source or to a system ground of a system employing the single to differential interface method 800. The differential signals may be referenced to voltages of a power supply that is used to bias the differential receiver.

Figure 9:
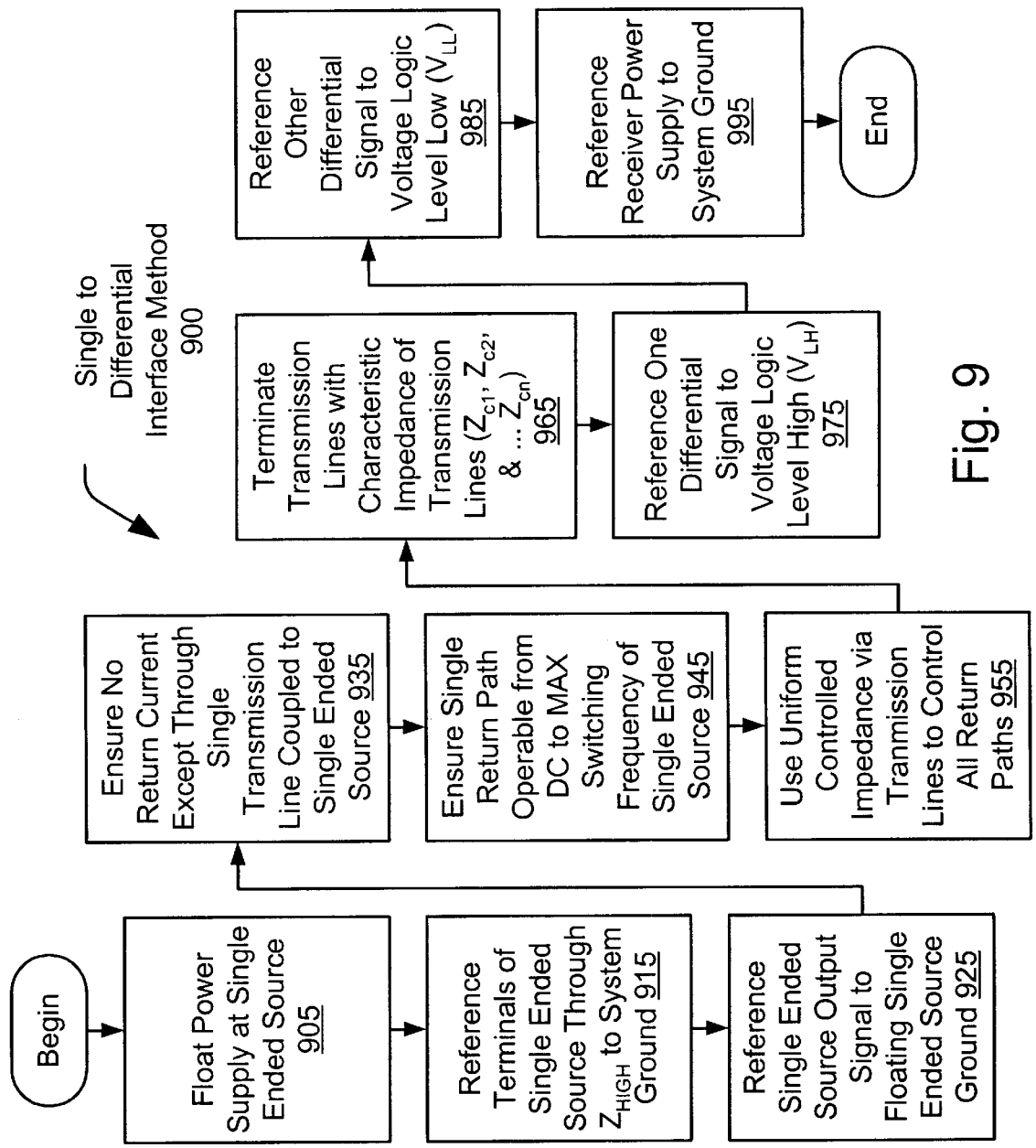
FIG. 9 is a functional block diagram illustrating another embodiment of a single to differential interface method performed in accordance with the present invention.

FIG. 9 is a functional block diagram illustrating another embodiment of a single to differential interface method 900 performed in accordance with the present invention. In a block 905, a power supply at a single ended source is floated. Then, in a block 915, the terminals of the single ended source are referenced through high impedances ($Z_{HIGH}$) to a system ground. In a block 925, a single ended source output is referenced to the floating single ended source ground.

In a block 935, it is ensured that there are no current return paths except through a single transmission line coupled to the single ended source. Moreover, in a block 945, it is ensured that the single return path is operable across a broad range of operational switching frequencies of the single ended source. This range of frequencies includes frequencies from DC to a maximum switching frequency of the single ended source. In embodiments where the single ended source is a clock source, then the range of frequencies includes frequencies from DC to the maximum clock switching frequency of the clock source. In a block 955, uniform controlled impedance is used via transmission lines to control all the return current paths of a system employing the single to differential interface method 900.

In a block 965, the various transmission lines are terminated with their respective characteristic impedances as shown by $Z_{c1}$, $Z_{c2}$, and ... $Z_{cn}$. In a block 975, one of the differential signals is referenced to a voltage logic level high as shown by $V_{LH}$. In a block 985, the other of the differential signals is referenced to a voltage logic level low as shown by $V_{LL}$. Ultimately, in a block 995, the receiver power supply is referenced to a system ground that employs the single to differential interface method 900.

The particular order of the various functional blocks as shown within the FIGS. 7, 8, and 9 may be transposed and interchanged in certain embodiments of the invention. The exemplary embodiments are used to show the operation of the present invention. Clearly, in designing and performing a method that is within the scope and spirit of the invention, certain orders of the functional blocks may be moved around and interchanged.

In view of the above detailed description of the present invention and associated drawings, other modifications and variations will now become apparent to those skilled in the art. It should also be apparent that such other modifications and variations may be effected without departing from the spirit and scope of the present invention.

What is claimed is:

1. A single to differential interface method, comprising:

referencing a single ended source output signal to a floating single ended source ground;

implementing a differential interface that is referenced to a system ground; and referencing a plurality of differential signals to a plurality of receiver power supply voltages.

2. The method of claim 1, wherein one of the plurality of differential signals is referenced to at least one of a voltage logic level low and a voltage logic level high.

3. The method of claim 1, further comprising using uniform impedance control and the uniform impedance control is operable to ensure a single return current path.

* * * * *